United States Patent
Janssen et al.

(10) Patent No.: US 6,408,340 B1
(45) Date of Patent: Jun. 18, 2002

(54) METHOD AND APPARATUS FOR TRANSFERRING DATA BETWEEN ELECTRICAL COMPONENTS

(75) Inventors: John J. Janssen, Round Lake Beach; William T. Waldie; Steven J. Olsen, both of Libertyville; William Kolofa, Bartlett, all of IL (US)

(73) Assignee: Motorola, Inc., Schaumburg, IL (US)

( * ) Notice: Subject to any disclaimer, the term of this patent is extended or adjusted under 35 U.S.C. 154(b) by 47 days.

(21) Appl. No.: 09/633,586

(22) Filed: Aug. 7, 2000

(51) Int. Cl.[7] ............................................. G06F 15/16
(52) U.S. Cl. ...................... 709/248; 709/231; 709/400; 713/400; 713/600; 455/313; 455/315; 455/255
(58) Field of Search ................................ 709/248, 217, 709/231, 400; 713/400, 500, 600; 710/58, 61; 455/302, 310, 311, 313, 315, 255, 118, 130, 126, 182.1; 341/100, 101; 348/735, 725; 257/698

(56) References Cited

U.S. PATENT DOCUMENTS

| 5,438,590 A | * | 8/1995 | Tzukerman et al. | |
| 5,490,282 A | * | 2/1996 | Dreps et al. | 710/1 |
| 5,722,040 A | * | 2/1998 | Bjerede et al. | 455/76 |
| 5,764,965 A | * | 6/1998 | Poimboeuf et al. | |
| 6,009,317 A | * | 12/1999 | Wynn | 455/296 |
| 6,031,473 A | * | 2/2000 | Kubinec | 341/100 |
| 6,122,327 A | * | 9/2000 | Watanabe et al. | |
| 6,160,859 A | * | 12/2000 | Martin et al. | |

* cited by examiner

Primary Examiner—Ario Etienne
(74) Attorney, Agent, or Firm—Brian M. Mancini

(57) ABSTRACT

A method of transferring data between a first electrical component (16) and a second electrical component (18), which are both coupled to a common oscillator (62) that oscillates at a first frequency, the first electrical component (16) generating a first bit stream having a second frequency that is a fraction of the first frequency and having a first number of bits, generating an indicator signal having a third frequency that is a fraction of the first frequency and that is indicative of a type of data represented by the first bit stream, and coupling the first bit stream and the indicator signal to the second electrical component. The second electrical component (18) sampling the first bit stream and the indicator signal at a fourth frequency that is substantially identical to the second frequency, thereby recovering the first bit stream generated by the first electrical component (16) and determining the type of data contained in the first bit stream.

20 Claims, 3 Drawing Sheets

METHOD AND APPARATUS FOR TRANSFERRING DATA BETWEEN ELECTRICAL COMPONENTS

FIELD OF THE INVENTION

The present invention relates in general to a method and apparatus for transferring digital information between electrical components and, in particular, to a method and apparatus for transferring digital information between electrical components without the use of a dedicated data clock or data over sampling.

BACKGROUND OF THE INVENTION

Presently, it is known for two or more electronic devices to exchange information or data using a serial data stream. Known methods of data transfer include a serial peripheral interface (SPI) that uses a dedicated data clock, data and enable signals to transfer serial data. Such interfaces are typically used in applications requiring data to be transferred from one electronic device or component to another electronic device or component.

One particular application in which data is transferred between electrical components is found in integrated circuit architectures used in wireless products that have a radio frequency integrated circuit (RF IC) and a baseband integrated circuit (BB IC). The RF IC receives and downconverts RF signals to baseband data signals that are coupled to the BB IC for further processing. The BB IC, among its various functions, may process the baseband data signals to develop a digital error or frequency control signal that is coupled to the RF IC. The RF IC may use the frequency control signal to correct and control its receive frequency synchronization. Additionally, the BB IC may generate a digital audio signal that may represent audio, such as voice, which is coupled to the RF IC for subsequent broadcast.

The use of an SPI to transfer the baseband data signals, the digital frequency control signal and the digital audio signal between the RF IC and the BB IC may require as many as nine dedicated pins on the integrated circuit chip (three pins for each signal to be transferred) and, therefore, may add cost and complexity to both the RF IC and the BB IC.

DETAILED DESCRIPTION OF THE PREFERRED EMBODIMENTS

Figure 1:
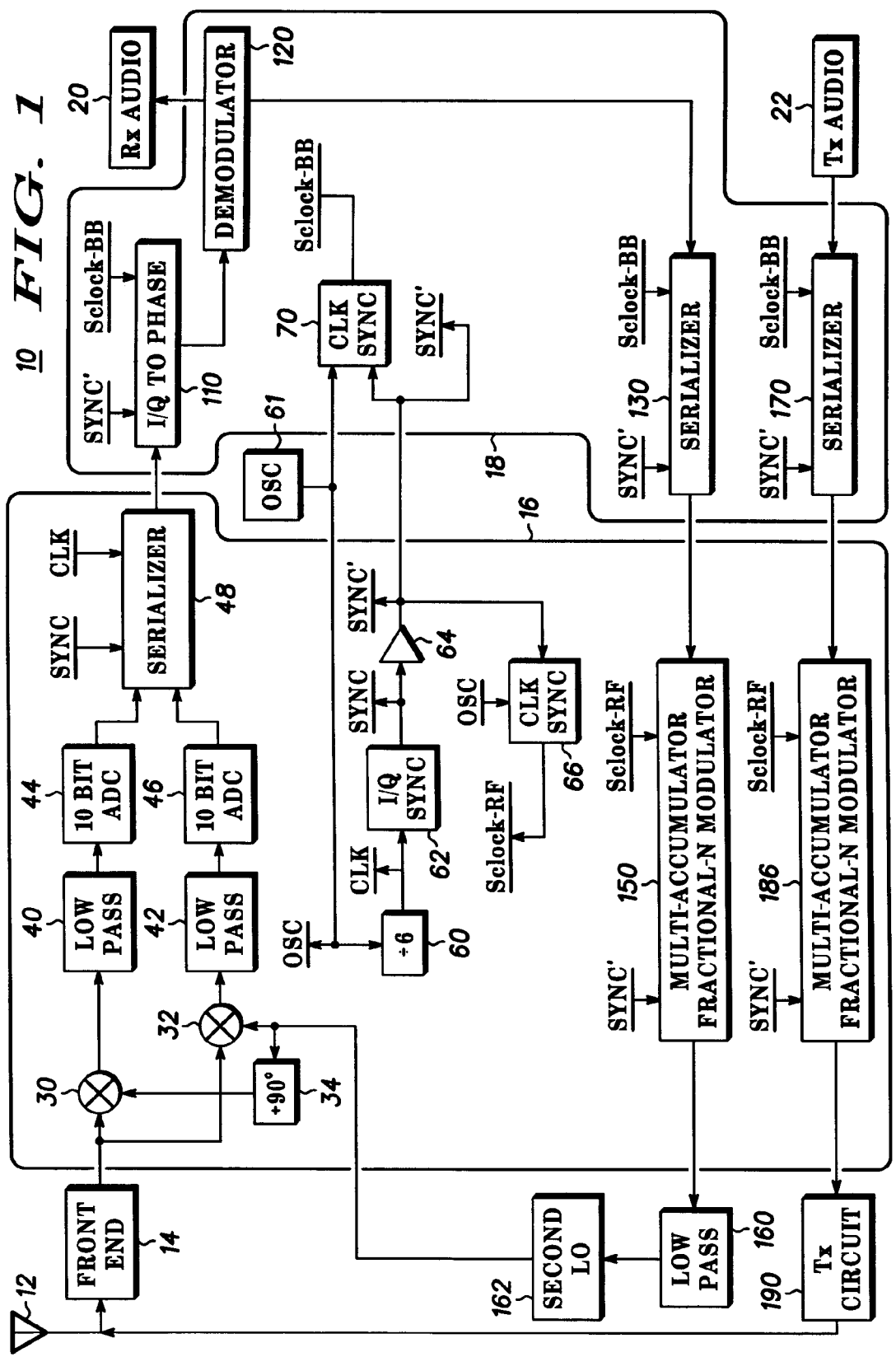
FIG. 1 is a block diagram illustrating a digital interface between a radio frequency integrated circuit (RF IC) and a baseband integrated circuit (BB IC).

Referring now to FIG. 1, a personal communication device 10, such as a cellular telephone or the like, may generally include an antenna 12, front end circuitry 14, a radio frequency integrated circuit (RF IC) 16, a baseband integrated circuit (BB IC) 18, receive (RX) audio circuitry 20 and transmit (TX) audio circuitry 22. The antenna 12 may receive an RF signal broadcast from a transmitter, such as a cellular base station (not shown), and may couple the RF signal to the front end circuitry 14. The front end circuitry may process the RF signal and couple the processed RF signal to the RF IC 16, wherein the processed RF signal may be fed to mixers 30 and 32, which may be fed with local oscillator signals that may be 90° out of phase with respect to one another, due to a phase shifter 34. The mixer 30 may generate a quadrature component of the RF signal and couple the quadrature component to a low pass filter 40. Similarly, the mixer 32 may generate an in-phase component of the RF signal and couple the in-phase component to a low pass filter 42. After the quadrature and the in-phase components are filtered by the low pass filters 40, 42, the in-phase and quadrature components may be each coupled to 10 bit analog to digital converters 44, 46. The output of the 10 bit analog to digital converter 44 is a 10 bit digital signal representative of the quadrature component of the RF signal. Similarly, the output of the 10 bit analog to digital converter 46 is a 10 bit digital signal representative of the in-phase component of the RF signal. The bit streams from the 10 bit analog to digital converters 44, 46 may be coupled to a serializer 48.

The serializer 48 may also receive a Sync signal and a clock signal, both of which may be used to control the output of the serializer 48. The clock signal may be generated by a divider 60 that is coupled to an oscillator 61. In one embodiment, the oscillator 61 may be separate from the RF IC 16 and may have a frequency of 7.68 megahertz (MHz). Alternatively, the oscillator 61 may be integrated with the RC IC 16. Either way, the divider 60 may divide the oscillator frequency by a factor of six to generate a clock signal having a frequency of 1.28 MHz. The Sync signal may be generated by an I/Q Sync generator 62 that may divide the clock signal from the divider 60 by a factor of twenty to produce a 64 kilohertz (KHz) Sync signal. More detail regarding the timing of the clock and Sync signals will be described hereinafter in conjunction with FIG. 2.

Upon receiving the bit streams from the 10 bit analog to digital converters 44, 46 and the clock and Sync signals, the serializer 48 may generate an output bit stream having both the quadrature and the in-phase bits from the 10 bit analog to digital converters 44, 46 therein. The output bit stream from the serializer 48 may be coupled to the BB IC 18, where it may be received and processed in a manner described in detail below.

In addition to the output bit stream from the serializer 48, the oscillator 61 output may be coupled to the BB IC 18. A buffer 64 in the RF IC 16 may receive the Sync signal from the I/Q Sync generator 62 and may generate a Sync' signal that is also coupled to the baseband IC 18. The Sync signal, which is generated by the I/Q Sync generator 62, is a synchronization signal that is local only to the RF IC 16 and is used by the serializer 48 to transmit information from the RF IC 16 to the BB IC 18. The Sync' signal may also be coupled to the baseband IC 18. Due to circuit board capacitance or inductance and a finite output impedance of the buffer 64, the Sync' signal may be slightly skewed with respect to the Sync signal. The Sync' signal and the oscillator signal may both be coupled to a clock synchronizer 66, which generates an Sclock-RF signal representative of a synchronized clock in the RF IC 16. The clock synchronizer 66 may be a divider that divides the oscillator signal by a factor of six, wherein the clock synchronizer 66 may be reset by the Sync' signal so that a negative edge of the Sclock-RF signal coincides with a state transition of the Sync' signal. Accordingly, the Sclock-RF signal may have substantially the same frequency as the clock signal (e.g., if the oscillator 61 frequency is 7.68 MHz, the clock signal will be 1.28

MHz) and may be synchronized with the Sync' signal. The RF IC 16 uses the Sync' signal and the Sclock-RF signal to receive information from the BB IC 18.

The BB IC 18 may also contain a clock synchronizer 70 that may receive the oscillator signal and the Sync' signal from the RF IC 16 and may generate an Sclock-BB signal representative of a synchronized clock on the BB IC 18. Like the clock synchronizer 66, the clock synchronizer 70 may divide the oscillator signal by a factor of six and may be reset at every transition of the Sync' signal. The clock synchronizer 70 maintains the timing of the Sclock-BB signal because the periodic reset caused by the Sync' signal also resets the clock synchronizer 66 and thereby synchronizes the Sclock-BB signal with the Sclock-RF signal. Sclock-BB and Sclock-RF are then used to maintain alignment of data words that are transmitted between the RF IC 16 and the BB IC 18.

Figure 2:
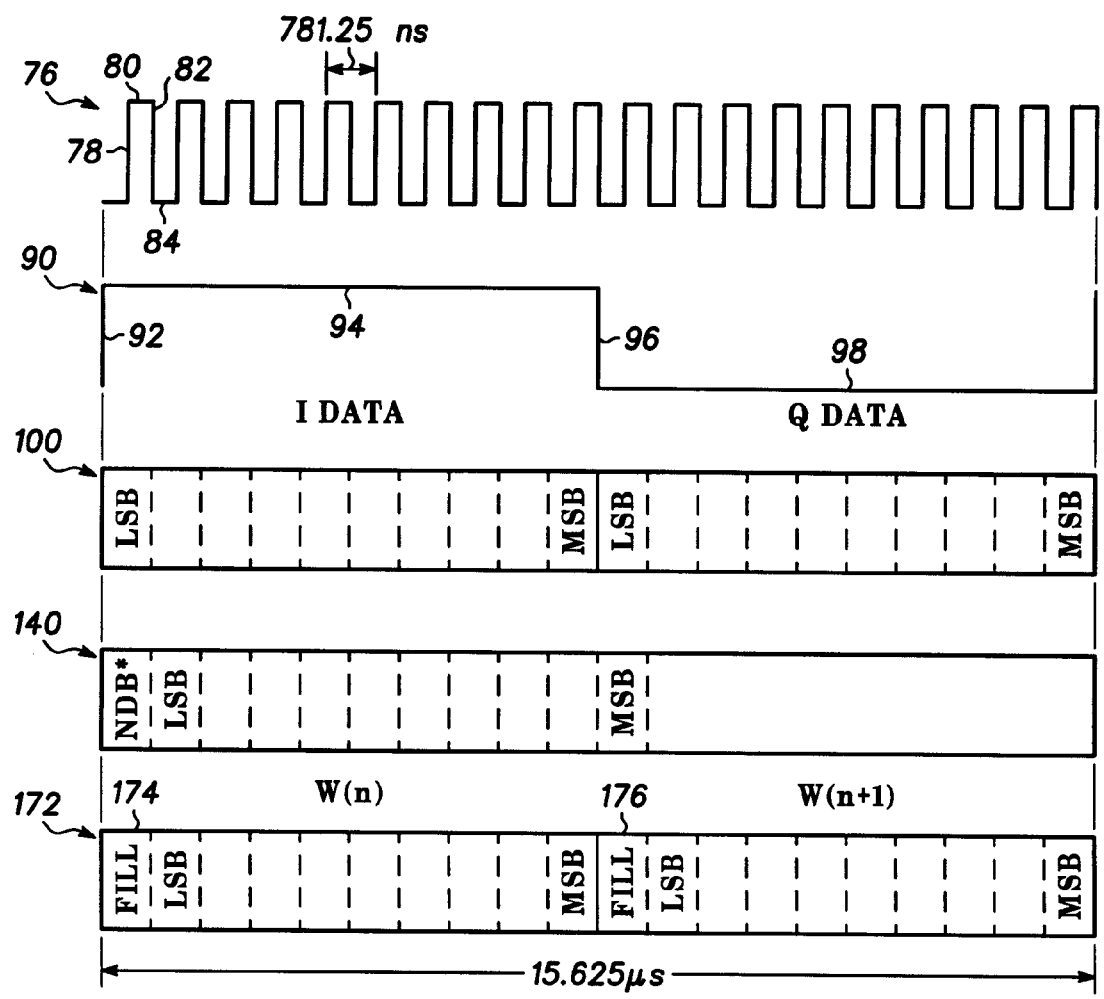
FIG. 2 is a signal diagram illustrating the timing of various signals that may be used to couple data between the RF IC and the BB IC shown in FIG. 1.

The clock signals (e.g., the clock, the Sclock-BB and the Sclock-RF) are represented in FIG. 2 by a clock signal 76. The clock signal 76 has a rising edge 78, a high state 80, a falling edge 82 and a low state 84. As shown in FIG. 2, in one embodiment the clock signal 76 may have a period of 781.25 nanoseconds (ns), which corresponds to a clock frequency of 1.28 MHz. The synchronization signals (e.g., the Sync signal and the Sync' signal) are represented in FIG. 2 by a synchronization signal 90, having a rising edge 92, a high state 94, a falling edge 96 and a low state 98. The sychronization signal 90 changes states (from low to high or from high to low) every time 10 falling edges 82 of the clock signal 76 occur. Accordingly, the synchronization signal 90 has a period of 15.625 microseconds ($\mu s$), which corresponds to a frequency of 64 KHz.

Also shown in FIG. 2 is a data signal timing diagram 100 that represents the timing of the output bit stream generated by the serializer 48 of the RF IC 16 and received by the BB IC 18. For example, returning to FIG. 1, the output bit stream that is coupled from the serializer 48 to the BB IC 18 may contain alternating sequences of in-phase information and quadrature information, wherein each sequence contains ten bits. The in-phase information may be clocked out of the serializer 48 while the synchronization signal 90 is high, and the quadrature information may be clocked out of the serializer 48 while the synchronization signal is low. In other alternative embodiments, the in-phase information may be clocked out of the serializer 48 while the synchronization signal 90 is low and the quadrature information may be clocked out of the serializer 48 while the synchronization signal 90 is high.

The BB IC 18 includes an I/Q to phase converter 110 that receives the output bit stream from the serializer 48, the Sync' signal and the Sclock-BB signal. As shown in the data signal timing diagram 100 of FIG. 2, the I/Q to phase converter 110 clocks in data from the serializer 48 on every rising edge 78 of the clock signal 76. As the I/Q to phase converter 110 clocks in the data bit by bit, the I/Q to phase converter 110 knows whether the clocked bits represent in-phase information or quadrature information based on the state of the Sync' signal represented in FIG. 2 by the synchronization signal 90. For example, when the synchronization signal 90 is in the high state 94, the I/Q to phase converter 110 may interpret the output data received from the serializer 48 as in-phase data. Conversely, when the synchronization signal 90 is in the low state 98, the I/Q to phase converter 110 may interpret the output data received from the serializer 48 as quadrature information. Because the I/Q to phase converter 110, which may be thought of as a data receiver, is synchronized with the serializer 48, the I/Q to phase converter 110 can receive an output bit stream without the use of a dedicated data clock and without over sampling the output bit stream.

As the I/Q to phase converter 110 receives the data from the serializer 48, it converts the data from in-phase and quadrature format to differential phase format and couples the differential phase formatted information to a demodulator 120. The demodulator 120 may produce an audio signal that may be coupled to the RX audio circuitry 20 to produce an analog audio signal that may be coupled to, for example, an earpiece speaker. The demodulator 120 may also produce a signal representative of a baseband offset frequency between the personal communication device 10 and a base station (not shown) with which the personal communication device 10 is communicating.

The signal representative of the baseband offset frequency may be coupled from the demodulator 120 to a serializer 130, which operates in substantially the same manner as the serializer 48 of the RF IC 16. The serializer 130 clocks 10 bit data words to the RF IC 16. The 10 bit data words are representative of the frequency control signal (referred to hereinafter as a 10 bit frequency control signal) and are clocked at a rate determined by the Sclock-BB signal. A data signal timing diagram 140, shown in FIG. 2, illustrates the timing at which the 10 bit frequency control signal from the serializer 130 may be clocked. Specifically, on the first rising edge 78 of the clock signal 76 that occurs after the rising edge 92 of the sychronization signal 90, a new data bit 142 may be set. The new data bit 142 informs the RF IC 16 as to whether it should expect information from the BB IC 18. For example, if the new data bit 142 is a logical one, the RF IC 16 may be programmed to expect more data that will be clocked from the serializer 130 on subsequent clock pulses. Conversely, if the new data bit 142 is a logical zero, the RF IC 16 may be programmed to ignore any subsequent "data" that may appear to follow. When the new data bit 142 is set, 10 bits of information will be clocked from the serializer 130 on the next 10 rising edges 78 of the clock signal 76. The data bits following the next data bit 142 may be arranged from least significant bit to most significant bit, or may be arranged from most significant bit to least significant bit.

As data is output from the serializer 130, it is received by a multi-accumulator fractional-N modulator, which may also be referred to as a fractional-N synthesizer (frac-N synth) 150. As will be appreciated by those having ordinary skill in the art, the frac-N synth 150 receives serial data that is used to program a rapidly tuning synthesizer. The frac-N Synth 150 has sufficient bandwidth so that it can be programmed to the baseband signal without introducing distortion. The frac-N synth 150 is clocked by the Sclock-RF signal and the Sync' signal and receives the 10 bit frequency control from the serializer 130 of the BB IC 18. Because the Sclock-RF signal is synchronized by the Sync' signal, which is the same signal used to synchronize the Sclock-BB signal that is used to clock the serializer 130, the frac-N synth 150 is sufficiently synchronized to the serializer 130 to receive the 10 bit frequency control signal without the use of a dedicated data clock and without oversampling the 10 bit frequency control signal.

The frac-N synth 150 receives the 10 bit frequency control signal and, based on that signal, reprograms its output frequency. The output signal from the frac-N synth 150 is coupled to a low pass filter 160, which filters the output signal and couples the filtered signal to a second local oscillator (LO) 162. Although, the low pass filter 160 and the LO 162 are shown in FIG. 1 as being separate from the RF IC 16, those having ordinary skill in the relevant art will readily appreciate that the low pass filter 162 and the LO 162 could be integrated into the RF IC 16. The filtered output signal from the low pass filter 162 provides frequency correction to the LO 162 to keep the LO 162 oscillating at the proper frequency and phase. The output of the LO 162 may be coupled to the mixer 32 and further coupled to the mixer 30 through the phase shifter 34. As described above, the mixers 30, 32 operate on the processed RF signal from the front end 14 to produce in-phase and quadrature components on the processed RF signal.

The BB IC 18 also includes a serializer 170 that is clocked by the Sclock-BB signal and that receives a digital audio signal from the TX audio circuitry 22. The serializer 170 may couple the digital audio signal to the RF IC 16 in serial 9 bit words (referred to hereinafter as a 9 bit digital audio signal). Referring to a data signal timing diagram 172 shown in FIG. 2, on the first rising edge 78 of the clock signal 76 after a rising edge 92 of the synchronization signal 90, the serializer 170 may clock a filler bit 174 to the RF IC 16. In some applications the filler bit 174 provides no useful information to the RF IC 16 and is just used as a filler because the digital audio signal is only 9 bits long and 10 bits may be clocked out of the serializer 170 on each half cycle of the synchronization signal 90. In other applications, the filler bit 174 may be used to carry useful information. The 9 bits following the filler bit 174 form the 9 bit digital audio signal, which transfers audio to the RF IC 16 so that the RF IC 16 may modulate the audio onto a carrier signal for broadcast. In some applications, the 9 bit digital audio signal may have its bits arranged from least significant to most significant. In other applications, the bits of the 9 bit digital audio signal may be arranged from most significant to least significant.

Because the 9 bit digital audio signal may need to be coupled to the RF IC 16 more frequently than the 10 bit frequency control signal, a second 9 bit word of digital audio is coupled from the serializer 170 to the RF IC 16 following the falling edge 96 of the synchronization signal 90. A filler bit 176, which may be followed by 9 digital audio bits, is clocked out of the serializer 170 on the first rising edge 78 of the clock signal 76 following the falling edge 96 of the synchronization signal 90. Again, the 9 digital audio bits may be arranged from least significant to most significant or from most significant to least significant. Additionally, the filler bit 176 may or may not provide useful information to the RF IC 16.

A frac-N synth 186 disposed within the RF IC 16 receives the 9 bit digital audio signal from the serializer 170. Like the frac-N synth 150, the frac-N synth 186 is clocked by the Sclock-RF signal and the Sync' signal. Because the Sclock-RF signal is synchronized by the Sync' signal, which is the same signal used to synchronize the Sclock-BB signal that is used to clock the serializer 170, the frac-N synth 186 is sufficiently synchronized to the serializer 170 to receive the 9 bit digital audio signal without the use of a dedicated data clock and without the need to oversample the 9 bit digital audio signal. The frac-N synth 186, upon receiving the 9 bit digital audio signal, changes its output frequency to create a frequency modulated signal representative of the information in the 9 bit digital audio signal. The analog signal may be coupled to transmitter (TX) circuitry 190, which may be separate from or integrated with the RF IC 16. The TX circuitry 190 may include an upconverter or a mixer and/or various other components known to those having ordinary skill in the art. The frequency modulated signal from the TX circuitry 190 is coupled to the antenna 12, which broadcasts the signal.

Figure 3:
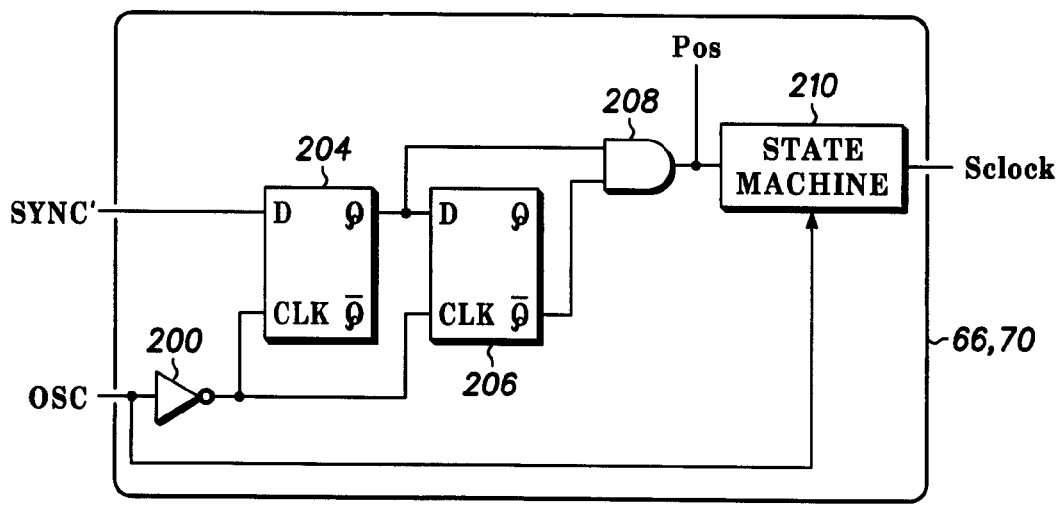
FIG. 3 is a block diagram of the clock synchronizers shown in FIG. 1

Turning now to FIG. 3, the clock synchronizer 66, 70 may include an inverter gate 200, a first D flip-flop 204, a second flip-flop 206, an AND gate 208 and a state machine 210. The output of the oscillator 61, which may be 7.68 MHz, may be coupled to the inverter gate 200 and the state machine 210. The output of the inverter gate 200 has the same frequency as the input to the inverter gate 200, except that the output of the inverter gate 200 is 180° out of phase with the input to the inverter gate 200. The output of the inverter gate 200 clocks the D flip-flops 204, 206 at every negative edge of the output from the oscillator 61. The Sync' signal is coupled to the first D flip-flop 204. The non-inverting output (Q) of the first D flip-flop 204 is coupled to the input (D) of the second D flip-flop 206 and is further coupled to the AND gate 208. The inverting output ($\overline{Q}$) of the second D flip-flop 206 is also coupled to the AND gate 208. The output of the AND gate 208, which is referred to herein as the Pos signal, is an edge detect of the Sync' signal running off the negative edge of the oscillator 61. For example, when two consecutive states of the Sync' signal are the same, the output of the AND gate 208 is a logical zero and when two consecutive states of the Sync' signal are different, the output of the AND gate 208 is a logical one.

The state machine 210, which receives inputs from the oscillator 61 and the AND gate 208, can change the state of its output (Sclock) on each pulse of the oscillator 61, wherein the state of the output Sclock signal is dependent on the state of the Pos signal provided to the state machine 210. Further detail regarding the implementation and operation of the state machine 210 is given with respect to FIG. 4 below.

Figure 4:
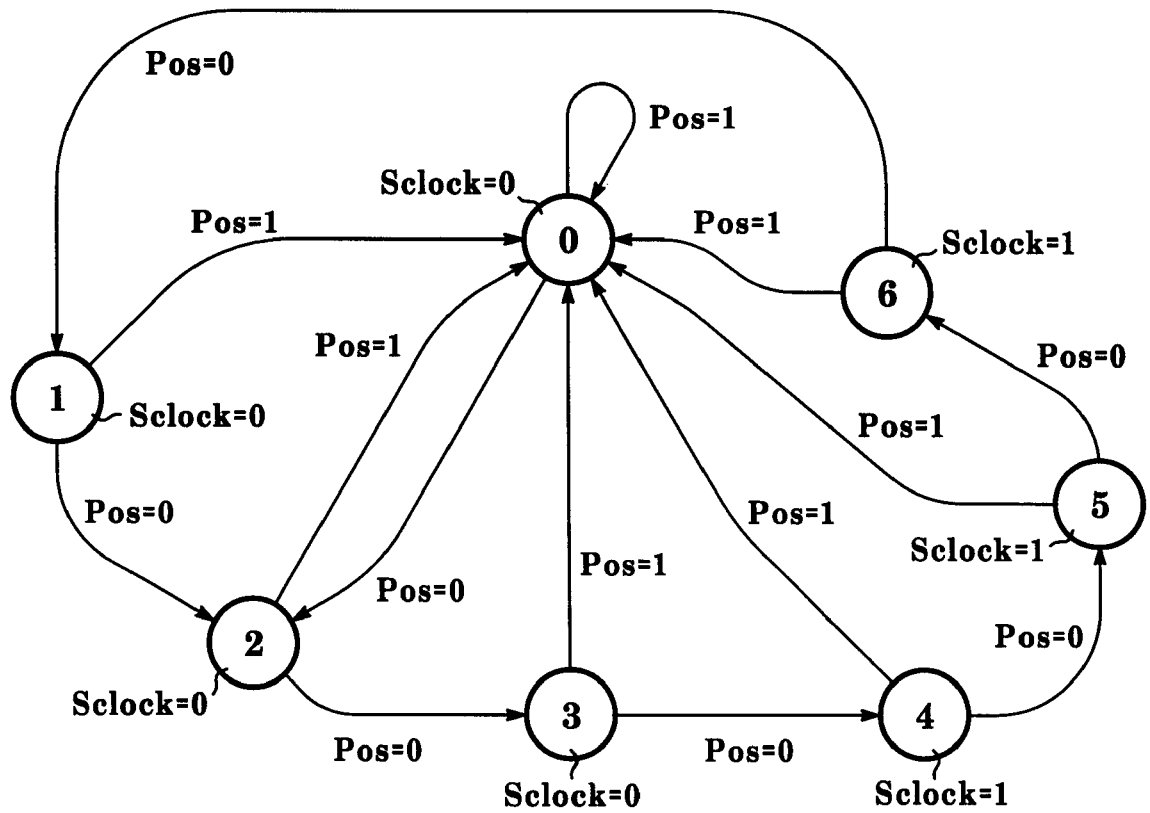
FIG. 4 is a model of a state machine employed by the clock synchronizer of FIGS. 1 and 3.

The state machine 210 may be implemented using combinational logic, application specific hardware or any other suitable electrical technology known to those having ordinary skill in the art. A register transfer language (RTL) such as VERILOG may be used to model the operation of the state machine 210 and to automatically produce the appropriate hardware to carry out the model. As shown in FIG. 4, the state machine model has seven states represented by seven circles labeled 0–6, each state having an associated Sclock output that is produced at each pulse of the oscillator 61 (FIG. 1) and the state of which is determined by the Pos signal (FIG. 3). For example, states 0–3 have an Sclock output equal to 0 and states 4–6 have an Sclock output equal to 1.

The state machine 210 may begin operation in the 0 state and may remain in the 0 state so long as the Pos signal is equal to 1. However, when the Pos signal goes low (becomes equal to 0), the state machine 210 may transition from state 0 to state 2 as indicated by an arrow from state 0 to state 2 that is labeled "Pos=0." As can be seen from FIG. 4, as long as the Pos signal is equal to 0, the state machine 210 will traverse from state 0 to state 2, to state 3 and so on until the machine 210 reaches state 6, wherein if the Pos signal is still equivalent to 0, the state machine 210 transitions from state 6 to state 1. Accordingly, as long as the Pos signal is equal to 0, the state machine 210 repeatedly traverses from state 1 to state 6 through states 2–5 and back to state 1 again. When the Pos signal is equal to 1, the state machine 210 will transition from whichever state it is currently in, to state 0, which may be referred to as the reset state.

During operation of the clock synchronizer 66, 70, when the input to the second D flip-flop 206 and the output of the second D flip-flop 206 are both a logical 1, the AND gate 208 generates a Pos signal equal to 1, which resets the state machine 210 to state 0. When the state machine is at state 0, Sclock equals 0. Therefore, each time the clock synchronizer 66, 70 detects an edge on the Sync' signal, the clock synchronizer 66, 70 creates a negative edge Sclock signal thereby synchronizing the Sclock signal with the Sync' signal. As shown in FIG. 4, states 1, 2 and 3 have an associated Sclock signal equal to 0 in states 4, 5 and 6 have an associated Sclock signal equal to 1. Accordingly, during periods of time, when no edges of the Sync' signal are detected, the state machine 210 repeatedly traverses from state 1 to state 6, thereby tracing out a 50% duty cycle signal having a frequency that is one-sixth of the oscillator frequency. During such operation, states 1, 2 and 3 represent the low state of the Sclock signal and states 4, 5 and 6 represent the high state of the Sclock signal.

The foregoing description is one embodiment of a device constructed in accordance with the teachings of the present invention. Consequently, it will be understood by those of ordinary skill in the art, that the teachings of the present invention may be carried out in software resident on a processor such as a digital signal processor or by dedicated hardware that is designed to carry out the various functions disclosed herein. Accordingly, the foregoing description has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

What is claimed is:

1. A method of transferring data between a first electrical component and a second electrical component, wherein the first electrical component and the second electrical component are both coupled to a common oscillator that oscillates at a first frequency, the method comprising the steps of:
    generating, at the first electrical component, a first bit stream having a second frequency that is a fraction of the first frequency and having a first number of bits;
    generating, at the first electrical component, an indicator signal having a third frequency that is a fraction of the first frequency;
    coupling, from the first electrical component to the second electrical component, the first bit stream and the indicator signal;
    sampling, at the second electrical component, the first bit stream and the indicator signal at a fourth frequency that is substantially identical to the second frequency, thereby recovering the first bit stream generated by the first electrical component; and
    aligning the sampling step based on the indicator signal.

2. The method of claim 1, wherein the step of generating the indicator signal includes the step of making the indicator signal indicative of a type of data represented by the first bit stream.

3. The method of claim 2, further comprising the step of determining the type of data represented by the first bit stream based on the state of the indicator signal.

4. The method of claim 1, further comprising the steps of:
    generating, at the second electrical component, a second bit stream having the fourth frequency and having a second number of bits;
    coupling, from the second electrical component to the first electrical component, the second bit stream; and
    sampling, at the first electrical component, the second bit stream at a fifth frequency that is substantially identical to the second frequency and the fourth frequency.

5. The method of claim 4, further comprising the steps of:
    generating, at the second electrical component, a third bit stream having the fourth frequency and having a third number of bits;
    coupling, from the second electrical component to the first electrical component, the third bit stream; and
    receiving, at the first electrical component, the third bit stream without use of a data clock being communicated between the first electrical component and the second electrical component by sampling the third bit stream at the fifth frequency.

6. The method of claim 5, wherein the step of generating the first bit stream comprises the step of generating a received data bit stream.

7. The method of claim 6, wherein the step of generating the second bit stream comprises the step of generating a synchronization error bit stream.

8. The method of claim 7, wherein the step of generating the third bit stream comprises the step of generating a voice bit stream associated with an audio signal.

9. The method of claim 6, wherein the step of generating the received data bit stream comprises the step of generating in-phase data and quadrature data.

10. The method of claim 9, wherein the indicator signal is in a first state when in-phase data is communicated from the first electrical component to the second electrical component and the indicator signal is in a second state when quadrature data is communicated from the first electrical component to the second electrical component.

11. The method of claim 10, wherein the first state comprises a logical one state.

12. The method of claim 11, wherein the second state comprises a logical zero state.

13. An apparatus for transferring data between a first electrical component and a second electrical component, wherein the first electrical component and the second electrical component are coupled to an oscillator signal, the apparatus comprising:
    a first frequency divider disposed in the first electrical component and adapted to receive the oscillator signal and to divide the oscillator signal to produce a clock signal having a first period;
    a synchronizer disposed in the first electrical component and adapted to receive the clock signal and to generate a synchronization signal having a first state and a second state, the synchronization signal having a second period that is a multiple of the first period;
    a serializer disposed in the first electrical component and adapted to receive the clock signal and the synchronization signal and to produce a received data bit stream having data associated with a first type of information and data associated with a second type of information, the received data bit stream having a period substantially equivalent to the first period;
    a clock synchronizer disposed in the second electrical component and adapted to receive the oscillator signal and to generate a synchronized clock signal having a period that is substantially synchronized to the clock signal; and
    a format converter disposed in the second electrical component and adapted to receive the received data bit stream, the synchronized clock signal and a modified version of the synchronization signal and to determine which portion of the received data bit stream is associated with the first type of information and which portion of the received data bit stream is associated with the second type of information and to convert the first type of information and the second type of information into an alternate format.

14. The apparatus of claim 13, further comprising:

an offset determiner disposed in the second electrical component, communicatively coupled to the format converter and receiving information that is in the alternate format, the offset determiner processing the alternate format information to generate a frequency offset signal; and an offset serializer disposed in the second electrical component and adapted to convert the frequency offset signal into a synchronization error bit stream.

15. The apparatus of claim 14, wherein the first electrical component further comprises a programmable modulator adapted to receive the synchronization error bit stream.

16. The apparatus of claim 15, further comprising transmit audio circuitry adapted to generate a digital audio signal wherein the second electrical component further comprises a voice serializer that converts the digital audio signal into a voice bit stream.

17. The apparatus of claim 16, wherein the first electrical component further comprises a second programmable modulator adapted to receive the voice bit stream and to modulate a carrier signal.

18. An apparatus for transferring data between a first electrical component receiving an oscillator signal of a first frequency and a second electrical component, comprising:

a frequency divider within the first electrical component, the frequency divider adapted to process the oscillator signal to produce a clock signal;

a synchronizer within the first electrical component, the synchronizer coupled to the frequency divider and adapted to process the clock signal to produce a synchronization signal;

a buffer within the first electrical component, the buffer coupled to the synchronizer and adapted to process the synchronization signal to produce a modified synchronization signal;

a serializer within the first electrical component, the serializer adapted to receive the synchronization signal and the clock signal and to output data at a frequency corresponding to the clock signal, wherein the output data is of a first type when the synchronization signal is a logic high and the output data is of a second type when the synchronization signal is a logic low;

a clock synchronizer within the second electrical component, the clock synchronizer adapted to receive the oscillator signal and the modified synchronization signal and to produce a synchronized clock signal; and a signal receiver within the second electrical component, the signal receiver adapted to decode the output data from the serializer using the modified synchronization signal and the synchronized clock signal.

19. The apparatus of claim 18, wherein the first type of output data comprises in-phase data.

20. The apparatus of claim 19, wherein the second type of output data comprises quadrature data.

* * * * *